United States Patent [19]

McGinn

[11] Patent Number: 4,945,415

[45] Date of Patent: Jul. 31, 1990

[54] SLEW ENHANCEMENT CIRCUIT FOR AN AUTOMATIC FREQUENCY CONTROL SYSTEM

[75] Inventor: Michael McGinn, Scottsdale, Ariz.

[73] Assignee: Motorola, Inc., Schaumburg, Ill.

[21] Appl. No.: 237,463

[22] Filed: Aug. 29, 1988

[51] Int. Cl.⁵ .................... H04N 5/50; H04B 1/18
[52] U.S. Cl. .................... 358/195.1; 331/25; 455/192; 455/251
[58] Field of Search ............ 358/195.1, 191.1, 174; 455/164, 192, 196, 251, 257, 263; 331/25; 329/179

[56] References Cited

U.S. PATENT DOCUMENTS

| | | | |
|---|---|---|---|
| 4,796,102 | 1/1989 | McGinn | 358/195.1 |
| 4,853,641 | 8/1989 | McGinn | 329/50 |

*Primary Examiner*—Tommy P. Chin
*Attorney, Agent, or Firm*—Michael D. Bingham

[57] ABSTRACT

A circuit for providing rapid charge and discharge of a capacitive load is utilized in conjunction with a phase detector error signal output generated in a television video demodulator system for controlling the operating frequency of the local oscillator. The circuit comprises a pair of comparators each biased to a respective threshold level whereby the first comparator provides an output signal when the error signal supplied thereto from the phase detector exceeds its threshold level and the second comparator provides an output signal when the error signal is less than its threshold level. An additional circuit is coupled to the outputs of the pair of comparators and is responsive to the first comparator for sourcing current to the capacitive load while being responsive to the second comparator for sinking current from the load. The capacitive load may be the AFC filter of an AFC loop of a television receiver wherein the local oscillator frequency is controlled by the voltage developed across the filter.

6 Claims, 2 Drawing Sheets

SLEW ENHANCEMENT CIRCUIT FOR AN AUTOMATIC FREQUENCY CONTROL SYSTEM

CROSS REFERENCE TO A RELATED APPLICATION

The subject matter of the present invention is related to the subject matter of a patent application filed on Aug. 7, 1987, entitled "AUTOMATIC FREQUENCY CONTROL SYSTEM", Ser. No. 81,041, now U.S. Pat. No. 4,796,102.

BACKGROUND OF THE INVENTION

The present invention relates to automatic frequency control (AFC) systems for use in television receivers and, more particularly, to circuitry for quickly charging and discharging the AFC filter capacitor of the AFC system.

The above referenced patent application discloses a video demodulator system for use in a television receiver wherein the demodulator system comprises an internal phase locked loop (PLL) in which a error signal is generated for driving the AFC loop of the receiver. As disclosed, the error signal is generated from the phase detector portion of the PLL and is utilized to provide a control voltage to adjust the local oscillator of the AFC loop in order to lock the video demodulator system to the IF composite television signal. The AFC voltage is derived by charging or discharging an AFC capacitor accordingly. This AFC voltage tunes the local oscillator to pull in and lock to the television composite signal.

Ideally, it is desired to have a large AFC filter to reduce or eliminate amplitude and phase modulation errors on the AFC signal(which has the effect of reducing the loop bandwidth). However, in contrast, it is desirable for the loop bandwidth of the AFC system to be as wide as possible in order to reduce AFC lock up time.

Hence, a need exist for an AFC system having means for rapidly charging and discharging the AFC filter capacitor when the PLL VCO is not at its normal operating frequency which enables a larger than normal filter capacitor to be realized thus reducing AFC loop bandwidth without increasing AFC capture time.

SUMMARY OF THE INVENTION

Accordingly, it is an object of the present invention to provide an improved AFC system.

Another object of the present invention is to provide an improved AFC system for a television receiver.

Still another object of the present invention is to provide a slew enhancement circuit for an AFC system.

In accordance with the above and other objects there is provided a slew enhancement circuit responsive to an applied input signal for quickly charging or discharging a capacitive load coupled to the circuit which comprises first and second comparators wherein the first comparator provides a current that is sourced to an output of the circuit when the input signal exceeds a first threshold and the second comparator sinks a current from the circuit output whenever the input signal is less than a second threshold to thereby charge and discharge the capacitive load respectively.

DETAILED DESCRIPTION OF THE PREFERRED EMBODIMENT

Figure 1:
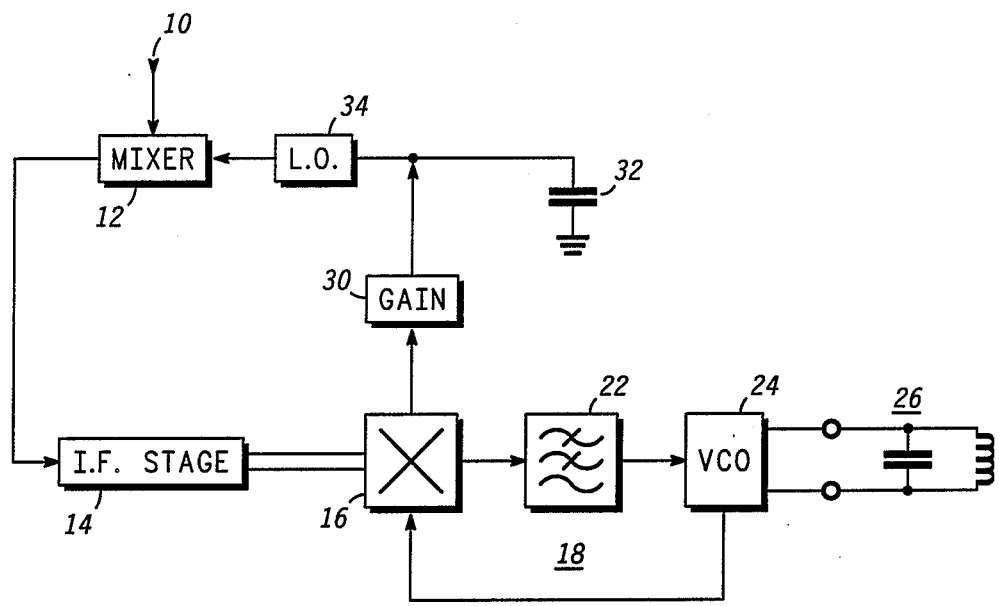
FIG. 1 is a simplified block diagram illustrating a phase locked loop video demodulator and automatic frequency control system useful for understanding the present invention.
Figure 2:
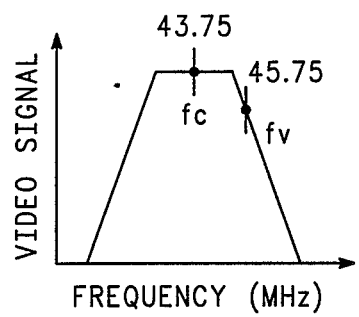
FIG. 2 is a waveform illustrating the bandpass characteristics of a typical IF filter used in the video demodulator system of FIG. 1.

Turning to FIG. 1, there is shown a simplified and partial block and schematic diagram of a video demodulator and AFC system. The video demodulator and AFC system is described in the aforementioned patent application entitled "AUTOMATIC FREQUENCY CONTROL SYSTEM". Briefly, the television composite signal is applied at input 10 to mixer stage 12 where it is combined with the signal from local oscillator (LO) 34 to produce the IF signal that is then applied to IF stage 14. LO 34 is typically operated at the IF frequency of 45.75 MHz (in the United States). The IF signal from mixer 12 is applied to the input of IF stage 14. IF stage 14 includes a filter having the characteristics shown in FIG. 2 plus an IF amplifier and limiter stages. The output of IF stage is supplied to the input of phase detector 16 which forms part of an internal PLL 18 in conjunction with low pass filter 22, voltage controlled oscillator (VCO) 24 and tuned circuit 26. Not shown since it is not germane to the present invention is a demodulator which would be coupled to the outputs of the aforementioned IF amplifier and VCO 24. VCO 24 may be operated at the intermediate frequency of 45.75 Mhz or, in the preferred embodiment, at half the intermediate frequency. In the latter case a X2 multiplier is utilized to multiply the output frequency of VCO by two as is understood.

As long as the frequency of the IF signal is at or very near the nominal frequency of 45.75 MHz, PLL 18 is phased locked thereto and the error signal produced form phase detector 16 is substantially zero. However, if for any reason the frequency of the IF signal applied to IF stage 14 is not at the required frequency an error signal is generated from multiplier 16 the polarity of which switches 180 degrees depending on whether the frequency of the IF signal is above or below 45.75 MHz. Thus, the output of phase detector 16 is utilized to control the frequency of LO 34 by producing a filtered voltage, developed across AFC capacitor 32.

The error signal from the PLL is amplified through gain stage 30, filtered across AFC capacitor 32 and applied to LO 34 (all of which comprise the AFC loop). It is understood that the time constant for the AFC loop is much slower than the VCO PLL loop. Thus, for example, if LO 34 for some reason has drifted off its nominal operating frequency and a composite signal is then applied to mixer 12, the IF signal will not be at 45.75 MHz. Hence, provided the frequency of the IF signal is within the acquisition range of PLL 18, VCO 24 will phase lock to the incoming IF signal, thus generating error signals for the VCO and the LO. Initially, the VCO frequency is changed from its nominal setting to that of the incorrect IF frequency. However, if the gain around the LO loop is much greater than that around the VCO loop, th IF frequency will be driven back towards its correct value and the VCO will track it maintaining phase lock. The final static conditions are a small error in the VCO frequency from it nominal value (required to produce the drive for the LO) and a large change in the IF frequency, which is now close to the required value.

Ideally, the aforedescribed AFC loop should have a low loop bandwidth and hence a large filter capacitor. A large filter capacitor is required to filter out the phase modulation produced by the IF filter characteristics (see FIG. 2) and vestigial side band transmission. Unfortunately, a low loop bandwidth leads to an unacceptable long AFC lock up time. Thus in most AFC systems a wider compromise bandwidth is chosen. The present invention provides a method to permit a larger than normal filter capacitor to be used while maintaining an acceptable tuning time by rapidly charging and discarging the capacitor when large errors in the IF frequency are detected. The circuit of the invention utilizes the error voltage generated from phase detector 16 of internal PLL 18 to generate a slew enhancement signal when the IF frequency error is excessive, the error voltage being a measure of the frequency error.

Figure 3:
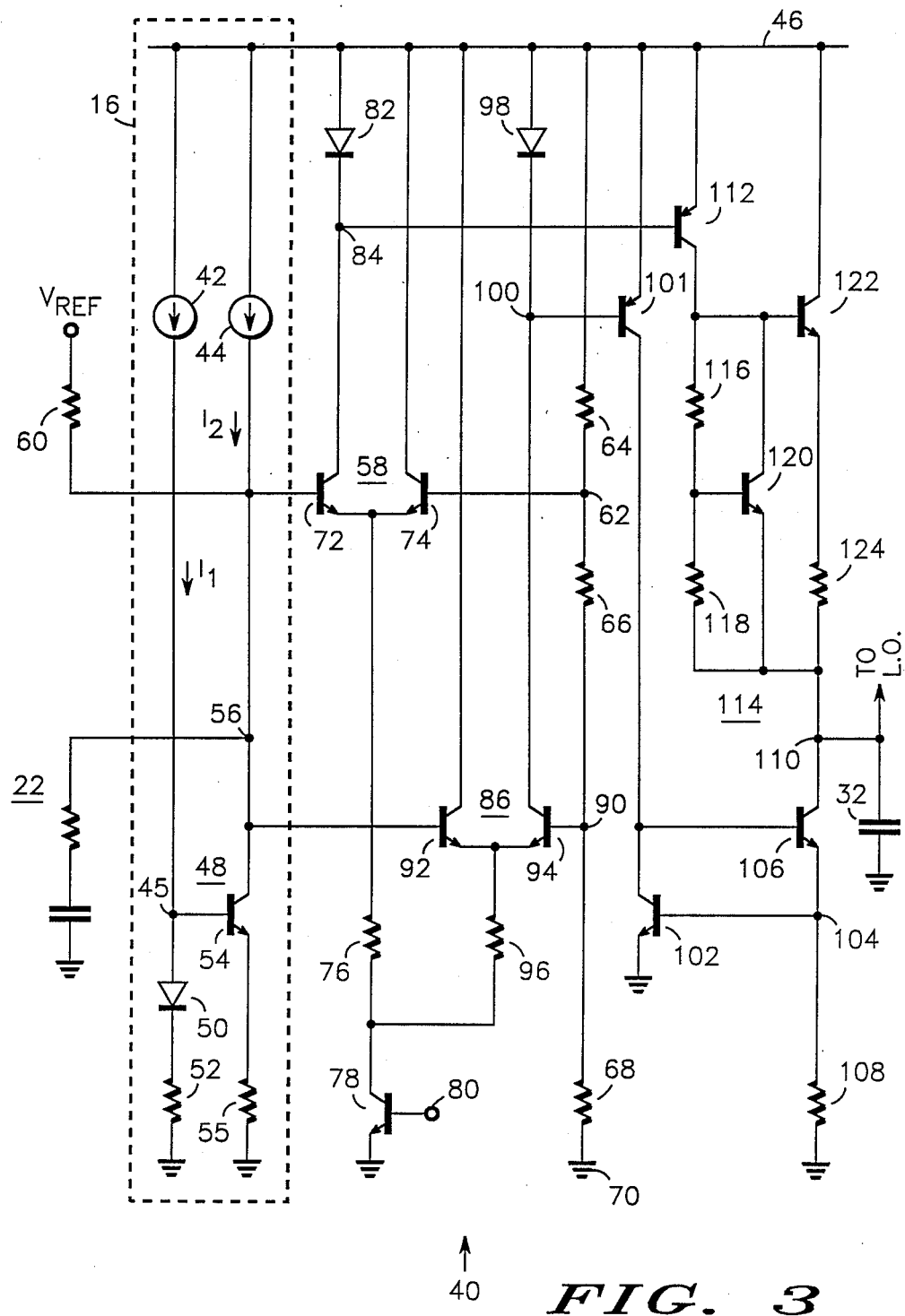
FIG. 3 is a schematic diagram illustrating the slew enhancement circuit of the present invention

Turning now to FIG. 3, there is shown slew enhancement circuit 40 of the present invention which is responsive to an error signal applied thereto for either sourcing or sinking current at its output depending on the polarity of the applied input signal. As will be explained, the output of circuit 40 is utilized to rapidly charge and discharge AFC filter capacitor 32 when the internal PLL of the television receiver (FIG. 1) is locked on the IF signal but is outside its normal operating frequency.

A typical output stage of phase detector 16 is shown within the dashed in outline. The output stage includes a pair of controlled current sources 42 and 44 for sourcing currents to nodes 45 and 60 respectively depending upon the sense of the error signal produced by the difference in the normal operating frequency of VCO 24 and the frequency of the IF signal. Current sources 42 and 44 are coupled to a common positive supply rail 46. Node 45 is coupled to the input of common current mirror circuit 48 which includes diode 50 and resistor 52 coupled in series between the input of the current mirror and a negative supply rail 70 as well as transistor 54 and resistor 55. The current sourced to node 45 is mirrored through transistor 54 from node 56. An output of the phase detector is taken at node 56 to develop the error voltage signal across low pass filter 22 where it is filtered and applied to the VCO of the PLL 18.

Slew enhancement circuit 40 is comprised of a pair of comparators 58 and 86 which are rendered operative as the PLL is locked to the IF signal and are switched accordingly by the phase error voltage at node 56 to either source or sink current at node 110. Comparator 58 has a first input coupled to node 56 and a second input coupled to node 62. Node 62 is connected to the interconnection of resistors 64 and 66 which in combination with resistor 68 form a bias reference as these resistors are series connected between rails 46 and 70. Hence, a first reference bias potential is supplied at node 62. Comparator 58 is realized by a pair of differentially connected transistors 72 and 74 the emitters of which are connected via resistor 76 in series with the collector-emitter of transistor 78, the base of which receives a control signal at terminal 80 whenever the PLL is locked to the IF signal such that the transistor is turned on to render both comparator 58 and 86 operative. The collector of transistor 74 is directly coupled to rail 46 while the output of comparator 58 is taken at node 84. Similarly, the inputs to comparator 86 are coupled to nodes 56 and 90, the latter node of which is biased at a second reference potential. Comparator 86 is comprised of a pair of differentially connected transistors 92 and 94 the emitters of which are coupled via resistor 96 to the collector of transistor 78. The output of comparator 86, the collector of transistor 94, is provided at node 100.

The output of comparator 58 is mirrored through the current mirror comprising diode 82 and transistor 112 and appears at the collector of the latter while the output of comparator 86 is mirrored by the current mirror comprising diode 98 and transistor 101 and appears at the collector of the latter. The collector output of transistor 112 drives constant current generator 114 which sources current to output 110. The collector output of transistor 101 is coupled to the input of a constant current circuit formed by transistors 102 and 106, the latter of which has its collector-emitter coupled between output 110 and node 104. A resistor 108 couples the emitter of transistor 106 and the base of transistor 102 to the negative rail. Thus, the value of the constant current is set by the voltage drop aross the resistor.

In operation, if PLL 18 is locked to the IF signal and is operating at its normal frequency, the output from phase detector 16 will be zero, i.e., the currents $I_1$ and $I_2$ will be equal and the voltage at node 56 is equal to $V_{REF}$ applied via resistor 60, $V_{REF}$ has a value that lies between the reference potentials appearing at nodes 62 and 90. In this state transistors 72 and 94 are both turned off and current is neither sourced or sank from the output of the slew enhancement circuit 40. If, however, the PLL is locked to the IF signal but is outside of its normal range an error signal is produced at the output of phase detector 16 of the correct sense to force a current to be either sourced or sank at output 110. For example, if the current $I_2$ is greater than $I_1$ the threshold level of comparator 58 is exceeded, transistor 72 is turned on while transistor 74 is turned off. In this condition a current is sourced from transistor 112 to drive constant current generator 114. A current is thus sourced to node 110 which rapidly charges filter capacitor 32 of the AFC loop. This will cause the operating frequency of LO 34 to be changed until the correct IF signal frequency is obtained. At this point, the error signal from phase detector 16 will be essentially zero whereby comparator 58 is rendered inoperative as transistor 72 is turned off. Similarly, if the error signal from phase detector 16 is such that $I_1$ is greater than $I_2$ then comparator 86 is rendered operative as the transistor 92 is turned off and transistor 94 is turned on since the potential at node 56 is less than the potential at node 90. The output of transistor 94 is mirrored through current mirrors comprising diode 98, transistor 101 turning on the constant current circuit formed by transistors 102, 106 to sink a current from node 110. Hence, filter capacitor 32 is rapidly discharged to reduce the control voltage to LO 34 until the operating frequency of the latter is changed to correct the frequency of the IF signal accordingly.

Hence, what has been described above is a circuit for providing rapid charge and discharge of the AFC filter capacitor of an AFC system when frequency errors are outside the normal range of the system. Thus, the AFC loop bandwidth can be decreased over that of an AFC system not incorporating the circuit of the present invention since the filter capacitor can be increased in size without compromising the AFC loop capture time.

What is claimed is:

1. A circuit responsive to an applied input signal for either sourcing or sinking current at an output thereof, comprising:
   bias circuit means for supplying first and second reference potentials at respective first and second outputs thereof;
   a first comparator having first and second inputs and an output, said first input of said first comparator being coupled to input of the circuit and said second input of said first comparator being coupled to said second output of said bias circuit means, said first comparator being responsive to the applied input signal being greater than said second reference potential for providing an output signal at said output of said first comparator;
   a second comparator having first and second inputs and an output, said first input of said second comparator being coupled to said input of the circuit and said second input of said second comparator being coupled to said first output of said bias circuit means, said second comparator being responsive to the input signal being less than said first reference potential for providing an output signal at said output of said second comparator;
   first circuit means coupled between said output of said first comparator and the output of the circuit and being responsive to said first comparator for sourcing current to the output of the circuit; and
   second circuit means coupled between said output of said second comparator and the output of the circuit and being responsive to said second comparator for sinking current at the output of the circuit.

2. The circuit of claim 1 wherein said first circuit means includes:
   a first current mirror circuit having an input coupled to said output of said first comparator and an output; and
   a first constant current generator circuit coupled between said output of said first current mirror circuit and the output of thecircuit.

3. The circuit of claim 2 wherein said second circuit means includes:
   a second current mirror circuit having an input coupled to said output of said second comparator and an output; and
   a second constant current generator circuit coupled between said output of said second current mirror circuit and the output of thecircuit.

4. In a television receiver including a video demodulator system having a phase locked loop and an AFC loop, the phase locked loop including a phase detector and the AFC loop including a filter capacitor, the improvement comprising a circuit coupled between an output of the phase detector and the filter capacitor for rapidly charging and discharging the filter capacitor in response to an error signal supplied thereto from said phase detector, said circuit including first and second comparators, said first comparator being responsive to the magnitude of said error signal being greater than a first reference potential for providing -an output signal, said second comparator being responsive to said error signal being less than a second reference potential for providing an output signal; and circuit means responsive to said output signals from said first and second comparators for respectively sourcing and sinking current at an output of the circuit, said output of the circuit being coupled to the filter capacitor.

5. An integrated automatic frequency control (AFC) and video demodulator system including a phase locked loop having a phase detector which produces an error signal when the phase locked loop is locked to a video intermediate frequency but is outside its normal operating range and including an AFC filter capacitor, the improvement comprising a circuit for charging and discharging the filter capacitor responsive to the error signal, the circuit including:
   a bias circuit for providing first and second reference potentials at respective first and second outputs thereof;
   a first comparator having first and second inputs and an output, said first input of said first comparator being coupled to an output of the phase detector, said second input of said first comparator being coupled to said second output of said bias circuit, said first comparator being responsive to the magnitude of the error signal being greater than the magnitude of said second reference potential for providing an output signal at said output of said first comparator;
   a second comparator having first and second inputs and an output, said first input of said second comparator being coupled to said output of the phase detector, said second input of said second comparator being coupled to said first output of said bias circuit, said second comparator being responsive to said magnitude of said error signal being greater than said first reference potential for providing an output signal at said output of said second comparator; and
   circuit means responsive to said output signals from said first and second comparators for respectively sourcing and sinking current at an output of said circuit, said output of said circuit being coupled to the ACF filter capacitor.

6. The circuit of claim 5 wherein said circuit means includes:
   a first current mirror having an input coupled to said output of said first comparator and an output;
   a first constant current source coupled between said output of said first current mirror and said output of said circuit means;
   a second current mirror having an input coupled to said output of said second comparator and an output; and
   a second constant current source coupled between said output of said second current mirror and said output of said circuit means.

* * * * *